United States Patent
Komplin et al.

(10) Patent No.: US 6,796,019 B2
(45) Date of Patent: Sep. 28, 2004

(54) PROCESS FOR MAKING A HEATER CHIP MODULE

(75) Inventors: Steven Robert Komplin, Lexington, KY (US); Ashok Murthy, Lexington, KY (US); Carl Edmond Sullivan, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 10/166,273

(22) Filed: Jun. 10, 2002

(65) Prior Publication Data

US 2002/0152607 A1 Oct. 24, 2002

Related U.S. Application Data

(62) Division of application No. 09/099,854, filed on Jun. 19, 1998, now Pat. No. 6,449,831.

(51) Int. Cl.[7] .................................................. H05B 3/00
(52) U.S. Cl. ..................... 29/611; 29/890.1; 29/889.22; 347/47; 347/56; 347/65; 216/27; 216/33
(58) Field of Search .............................. 347/17, 58, 63, 347/50, 56, 65; 216/33, 27, 16, 48; 29/611, 890.1, 889.22

(56) References Cited

U.S. PATENT DOCUMENTS

| 4,169,008 A | 9/1979 | Kurth |
| 4,558,333 A | 12/1985 | Sugitani et al. |
| 4,639,748 A | 1/1987 | Drake et al. |
| 4,786,357 A | 11/1988 | Campanelli et al. |
| 4,789,425 A | 12/1988 | Drake et al. |
| 4,822,755 A | 4/1989 | Hawkins et al. |
| 4,829,324 A | 5/1989 | Drake et al. |
| 5,010,355 A | 4/1991 | Hawkins et al. |
| 5,036,337 A | 7/1991 | Rezanka |
| 5,063,655 A | 11/1991 | Lamey et al. |
| 5,068,006 A | 11/1991 | Fisher |
| 5,075,250 A | 12/1991 | Hawkins et al. |

(List continued on next page.)

FOREIGN PATENT DOCUMENTS

| EP | 0 822 078 A2 | 2/1998 |
| EP | 0 822 080 A2 | 2/1998 |

OTHER PUBLICATIONS

"Orientation of the Third Kind; The Coming of Age of(110) Silicon" by D. L. Kendall and G. R. de Guel (Elsevier Science Publishers, Amsterdam), 1985.
"Submicron Accuracies in Anisotropic Etched Silicon Piece Parts—A Case Study" by T. L. Poteat, 1985.
"The Mechanism of Anisotropic Silicon Etching and Its Relevance for Micromachining" by H. Seidel (W. Germany) 1987.
H. T. Henderson & W. Hsieh, "Micromachining in Semiconductors as an On–Chip Manufacturing Technique for Micro–Electromechanical Systems," Proceedings, ASEE N. Central Spring Mtg, Southfield, MI, Apr. 7, 1989.

(List continued on next page.)

Primary Examiner—Minh Trinh
(74) Attorney, Agent, or Firm—Luedeka, Neely & Graham, P.C.

(57) ABSTRACT

A process is provided for forming a heater chip module comprising a carrier adapted to be secured to an ink-filled container, at least one heater chip having a base coupled to the carrier, and at least one nozzle plate coupled to the heater chip. The carrier includes a support substrate having at least one passage which defines a path for ink to travel from the container to the heater chip. The heater chip is secured at its base to a portion of the support substrate. At least the portion of the support substrate is formed from a material having substantially the same coefficient of thermal expansion as the heater chip base. A flexible circuit is coupled to the heater chip module such as by TAB bonding or wire bonding.

10 Claims, 7 Drawing Sheets

U.S. PATENT DOCUMENTS

| | | | |
|---|---|---|---|
| 5,113,204 A | | 5/1992 | Miyazawa et al. |
| 5,154,815 A | * | 10/1992 | O'Neill ................. 205/75 |
| 5,198,054 A | | 3/1993 | Drake et al. |
| 5,368,683 A | | 11/1994 | Altavela et al. |
| 5,387,314 A | | 2/1995 | Baughman et al. |
| 5,388,326 A | | 2/1995 | Beeson et al. |
| 5,408,189 A | | 4/1995 | Swart et al. |
| 5,408,739 A | | 4/1995 | Altavela et al. |
| 5,434,607 A | | 7/1995 | Keefe |
| 5,441,593 A | | 8/1995 | Baughman et al. |
| 5,450,109 A | | 9/1995 | Hock |
| 5,469,199 A | | 11/1995 | Allen et al. |
| 5,487,483 A | | 1/1996 | Kubby |
| 5,539,982 A | | 7/1996 | Hosono et al. |
| 5,565,901 A | | 10/1996 | Hawkins |
| 5,581,861 A | | 12/1996 | Lee et al. |
| 5,604,521 A | | 2/1997 | Merkel et al. |
| 5,649,359 A | | 7/1997 | Murakami et al. |
| 6,000,787 A | * | 12/1999 | Weber et al. ............. 347/65 |
| 6,039,439 A | * | 3/2000 | Komplin et al. ........... 347/65 |
| 6,164,762 A | * | 12/2000 | Sullivan et al. ............ 347/56 |
| 6,170,931 B1 | * | 1/2001 | Anderson et al. ........... 347/17 |
| 6,267,472 B1 | * | 7/2001 | Maher et al. .............. 347/65 |
| 6,449,831 B1 | * | 9/2002 | Komplin et al. ............ 2/611 |

OTHER PUBLICATIONS

"Compensation Structures for Convex Corner Micromachining in Silicon" by B. Puers and W. Sansen (Katholieke Universiteit Lewen, Belgium) 1990.

"The Mechanism of Anisotropic, Electrochemical Silicon Etching in Alkaline Solutions" by H. Seidel (Federal Republic of Germany) 1990.

"KOW Etch Rates of High–Index Planes from Mechanically Prepared Silicon Crystals" by E. Herr and H. Baltes (Physical Electronics Laboratory, Zurich, Switzerland) 1991.

U. Schnakenberg, W. Benecke, and P. Lange, THAHW Etchants for Silicon Micromachining, In Proc. Int. Conf. on Solid State Sensors and Actuators (Transducers 1991) pp. 815–818, San Francisco, Jun. 1991.

"Formation of Silicon Reentrant Cavity Heat Sinks Using Anisotropic Etching & Direct Wafer Bonding", by A. Goyal, R. C. Jaeger, S. H. Shavnani, C. D. Ellis, N. K. Phadke, M. Azimi–Rashti and J. S. Goodling (IEEE Electron Device Letters, vol. 14, No. 1), 1993.

Carl Edmond Sullivan, "Micromachined Vias for Ink Jet Printing"—A Thesis Submitted to the Faculty of the University of Louisville Speed Scientific School, Dept. of Electrical Engineering, first available to the public between Aug. 12, 1996, and Sep. 30, 1996, 83 pages.

* cited by examiner

PROCESS FOR MAKING A HEATER CHIP MODULE

CROSS-REFERENCE TO RELATED APPLICATIONS

This application is a division of U.S. Ser. No. 09/099,854, filed Jun. 19, 1998, now U.S. Pat. No. 6,449,831, issued Sep. 17, 2002, entitled "PROCESS FOR MAKING A HEATER CHIP MODULE,", and is related to contemporaneously filed Patent Applications U.S. Ser. No. 09/100,070, now U.S. Pat. No. 6,267,472, issued Jul. 31, 2001, entitled "INK JET HEATER CHIP MODULE WITH SEALANT MATERIAL," U.S. Ser. No. 09/100,485, entitled "A HEATER CHIP MODULE AND PROCESS FOR MAKING SAME," U.S. Ser. No. 09/100,544, entitled "AN INK JET HEATER CHIP MODULE," U.S. Ser. No. 09/100,538, entitled "A HEATER CHIP MODULE FOR USE IN AN INK JET PRINTER," and U.S. Ser. No. 09/100,218, now U.S. Pat. No. 6,170,931, issued Jan. 9, 2001 entitled, "INK JET HEATER CHIP MODULE INCLUDING A NOZZLE PLATE COUPLING A HEATER CHIP TO A CARRIER," the disclosures of which are incorporated herein by inference.

FIELD OF THE INVENTION

This invention relates to a process for forming a heater chip module adapted to be secured to an ink-filled container.

BACKGROUND OF THE INVENTION

Drop-on-demand ink jet printers use thermal energy to produce a vapor bubble in an ink-filled chamber to expel a droplet. A thermal energy generator or heating element, usually a resistor, is located in the chamber on a heater chip near a discharge nozzle. A plurality of chambers, each provided with a single heating element, are provided in the printer's printhead. The printhead typically comprises the heater chip and a nozzle plate having a plurality of the discharge nozzles formed therein. The printhead forms part of an ink jet print cartridge which also comprises an ink-filled container.

A plurality of dots comprising a swath of printed data are printed as the ink jet print cartridge makes a single scan across a print medium, such as a sheet of paper. The data swath has a given length and width. The length of the data swath, which extends transversely to the scan direction, is determined by the size of the heater chip.

Printer manufacturers are constantly searching for techniques which may be used to improve printing speed. One possible solution involves using larger heater chips. Larger heater chips, however, are costly to manufacture. Heater chips are typically formed on a silicon wafer having a generally circular shape. As the normally rectangular heater chips get larger, less of the silicon wafer can be utilized in making heater chips. Further, as heater chip size increases, the likelihood that a chip will have a defective heating element, conductor or other element formed thereon also increases. Thus, manufacturing yields decrease as heater chip size increases.

Accordingly, there is a need for an improved printhead or printhead assembly which allows for increased printing speed yet is capable of being manufactured in an economical manner.

SUMMARY OF THE INVENTION

In accordance with the present invention, a process is provided for forming a heater chip module comprising a carrier adapted to be secured to an ink-filled container, at least one heater chip having a base coupled to the carrier, and at least one nozzle plate coupled to the heater chip. The carrier includes a support substrate having at least one passage which defines a path for ink to travel from the container to the heater chip. The heater chip is secured at its base to a portion of the support substrate. A flexible circuit is coupled to the heater chip module such as by TAB bonding or wire bonding.

Two or more heater chips, positioned end to end, side by side or at an angle to one another, may be secured to a single support substrate.

Each of two or more heater chips coupled to a single support substrate may be dedicated to a different color. For example, three heater chips positioned side by side may be coupled to a single support substrate, wherein each heater chip receives ink of one of the three primary colors.

At least the portion of the support substrate is formed from a material having substantially the same coefficient of thermal expansion as the heater chip base. Thus, the heater chip base and the support substrate portion expand and contract at essentially the same rate. This is advantageous for a number of reasons. First, it is less likely that bonding material joining the heater chip to the carrier will fail. Further, if two or more heater chips are secured to the carrier, accuracy of dot placement is increased as the location of the heater chips relative to the paper is less likely to vary. It is also preferred that the support substrate portion be formed from a material having a thermal conductivity which is substantially the same as or greater than the thermal conductivity of the material from which the heater chip base is formed. Hence, the carrier provides a dissipation path for heat generated by the heater chip. Consequently, heat build up in the heater chip, which might occur if the thermal conductivity of the support substrate portion is less than that of the heater chip base, is avoided.

DETAILED DESCRIPTION OF PREFERRED EMBODIMENTS

Figure 1:
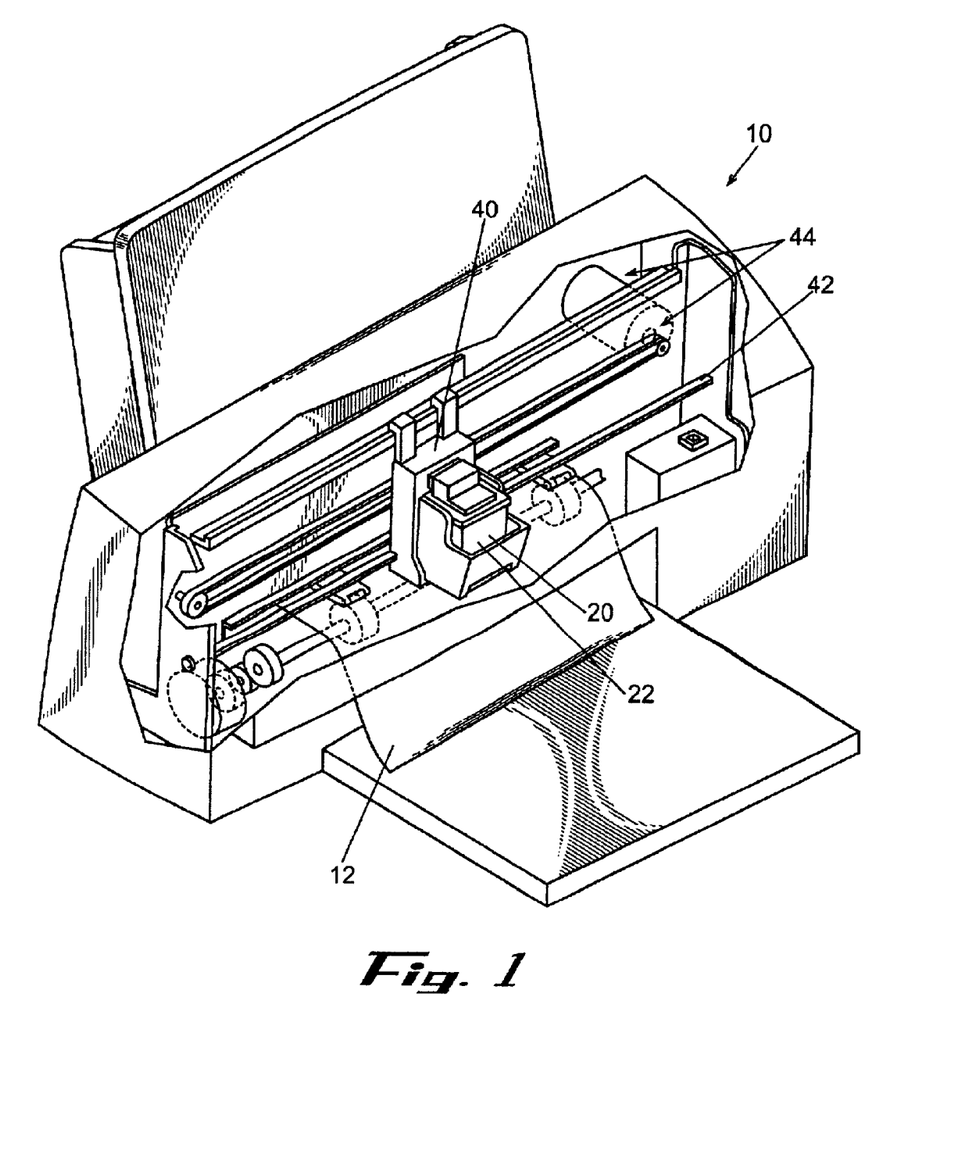
FIG. 1 is a perspective view, partially broken away, of an ink jet printing apparatus having a print cartridge constructed in accordance with the present invention.

Referring now to FIG. 1, there is shown an ink jet printing apparatus 10 having a print cartridge 20 constructed in accordance with the present invention. The cartridge 20 is supported in a carriage 40 which, in turn, is slidably supported on a guide rail 42. A drive mechanism 44 is provided for effecting reciprocating movement of the carriage 40 and the print cartridge 20 back and forth along the guide rail 42. As the print cartridge 20 moves back and forth, it ejects ink droplets onto a paper substrate 12 provided below it.

The print cartridge 20 comprises a container 22, shown only in FIG. 1, filled with ink and a heater chip module 50. The container 22 may be formed from a polymeric material. In the illustrated embodiment, the container 22 is formed from polyphenylene oxide, which is commercially available from the General Electric Company under the trademark "NORYL SE-1." The container 22 may be formed from other materials not explicitly set out herein.

Figure 2:
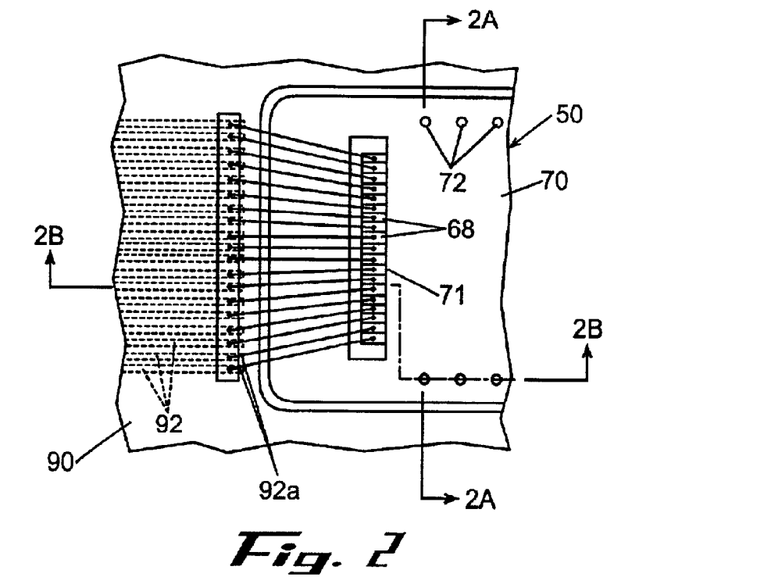
FIG. 2 is a plan view of a portion of a heater chip module constructed in accordance with a first embodiment of the present invention.
Figure 2A:
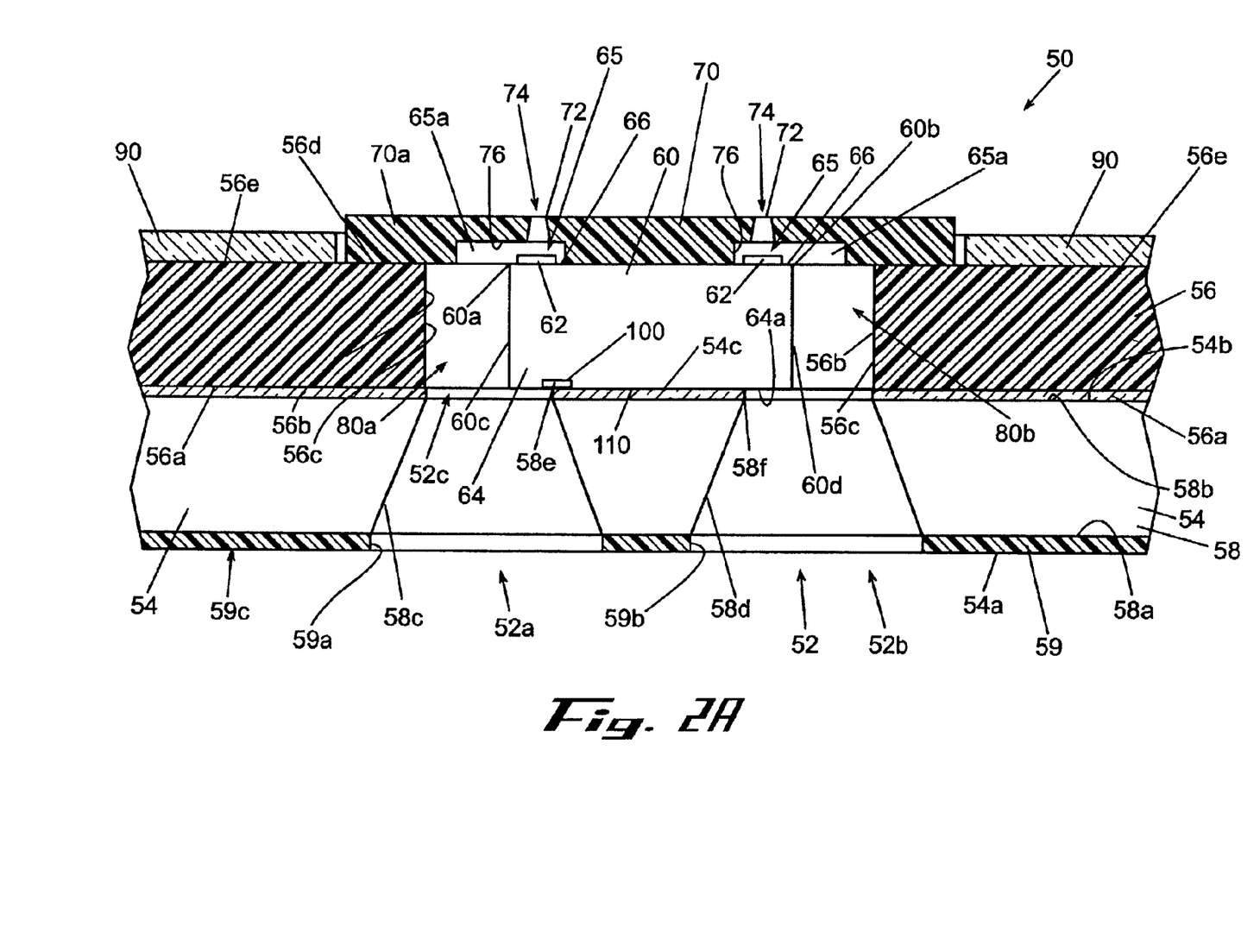
FIG. 2A is a view taken along view line 2A—2A in FIG. 2.
Figure 2B:
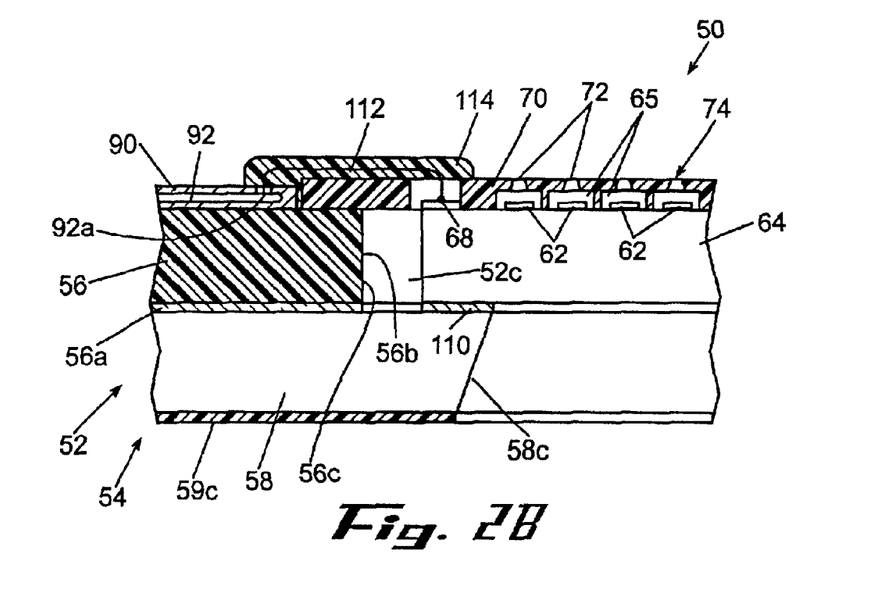
FIG. 2B is a view taken along view line 2B—2B in FIG. 2.

In the embodiment illustrated in FIGS. 2, 2A and 2B, the module 50 comprises a carrier 52, an edge-feed heater chip 60 and a nozzle plate 70. The heater chip 60 includes a plurality of resistive heating elements 62 which are located on a base 64, see FIG. 2A. In the illustrated embodiment, the base 64 is formed from silicon. The nozzle plate 70 has a plurality of openings 72 extending through it which define a plurality of nozzles 74 through which ink droplets are ejected. The carrier 52 is secured directly to a bottom side (not shown) of the container 22, i.e., the side in FIG. 1 closest to the paper substrate 12, such as by an adhesive (not shown). Thus, in the illustrated embodiment, there is no other element positioned between the carrier 52 and the container 22 except for the adhesive bonding the two elements together. An example adhesive which may be used for securing the carrier 52 to the container 22 is one which is commercially available from Emerson and Cuming Specialty Polymers, a division of National Starch and Chemical Company under the product designation "ECCOBOND 3193-17."

The nozzle plate 70 may be formed from a flexible polymeric material substrate which is adhered to the heater chip 60 via an adhesive (not shown). Examples of polymeric materials from which the nozzle plate 70 may be formed and adhesives for securing the plate 70 to the heater chip 60 are set out in commonly assigned patent applications, U.S. Ser. No. 08/966,281, entitled "METHOD OF FORMING AN INKJET PRINTHEAD NOZZLE STRUCTURE," by Ashok Murthy et al., filed on Nov. 7, 1997, which is a continuation-in-part application of U.S. Ser. No 08/519,906, entitled "METHOD OF FORMING AN INKJET PRINTHEAD NOZZLE STRUCTURE," by Tonya H. Jackson et al., filed on Aug. 28, 1995, the disclosures of which are hereby incorporated by reference. As noted therein, the plate 70 may be formed from a polymeric material such as polyimide, polyester, fluorocarbon polymer, or polycarbonate, which is preferably about 15 to about 200 microns thick, and most preferably about 20 to about 80 microns thick. Examples of commercially available nozzle plate materials include a polyimide material available from E. I. DuPont de Nemours & Co. under the trademark "KAPTON" and a polyimide material available from Ube (of Japan) under the trademark "UPILEX." The adhesive for securing the plate 70 to the heater chip 60 may comprise a phenolic butyral adhesive. A polyimide substrate/phenolic butyral adhesive composite material is commercially available from Rogers Corporation, Chandler, Ariz., under the product name "RFLEX 1100."

The nozzle plate 70 may be bonded to the chip 60 via any art recognized technique, including a thermocompression bonding process. When the plate 70 and the heater chip 60 are joined together, sections 76 of the plate 70 and portions 66 of the heater chip 60 define a plurality of bubble chambers 65. Ink supplied by the container 22 flows into the bubble chambers 65 through ink supply channels 65a. As is illustrated in FIG. 2A, the supply channels 65a extend from the bubble chambers 65 beyond first and second outer edges 60a and 60b of the heater chip 60. The resistive heating elements 62 are positioned on the heater chip 60 such that each bubble chamber 65 has only one heating element 62. Each bubble chamber 65 communicates with one nozzle 74.

The carrier 52 comprises a support substrate 54 and a spacer 56, see FIGS. 2A and 2B. The support substrate 54 includes a silicon plate 58 having first and second outer surfaces 58a and 58b, see FIGS. 2A and 8. The silicon plate 58 is also referred to herein as a portion of the support substrate 54. The plate 58 has a thickness $T_p$ of from about 400 microns to about 2500 microns and, preferably, from about 500 microns to about 1000 microns. First and second passages 58c and 58d extend through the silicon plate 58. In the illustrated embodiment, the passages 58c and 58d are generally rectangular where they meet the first and second outer surfaces 58a and 58b. They also converge inwardly from the first outer surface 58a to the second outer surface 58b. Alternatively, the passages 58c and 58d may be oval, elliptical or have another geometric shape.

Figure 8:
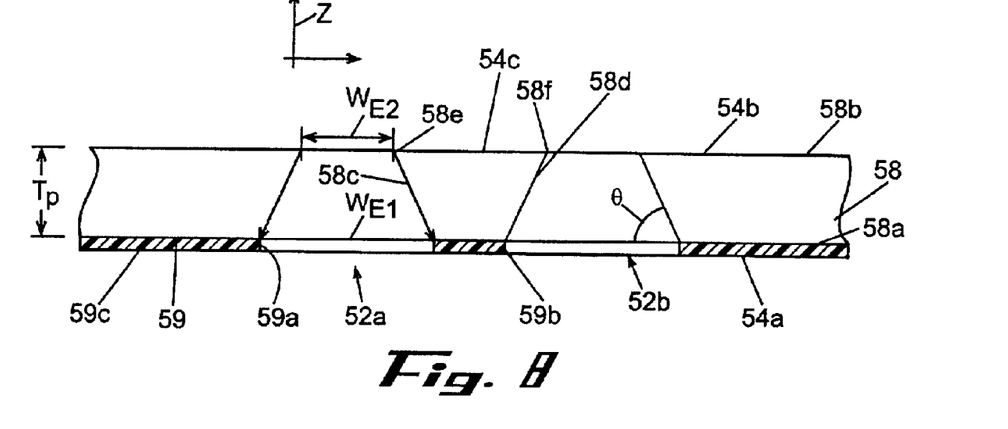
FIG. 8 is a cross sectional view of a portion of the support substrate of the heater chip module of FIGS. 2, 2A and 2B.

A first etch resistant material layer 59 is formed on the first outer surface 58a of the silicon plate 58, see FIG. 8. The first layer 59 may be formed from any one of a number of known etch resistant materials including, for example, silicon nitride, silicon carbide, aluminum, tantalum, and silicon dioxide. Other materials not explicitly set out herein may also be used when forming the layer 59. The first layer 59 has a thickness in the Z-direction, see FIG. 8, of from about 1 micron to about 20 microns, including all ranges subsumed therein, and preferably from about 1 micron to about 2.5 microns.

The first layer 59 includes first and second openings 59a and 59b extending completely through it which communicates with the passages 58c and 58d. The first opening 59a has generally the same shape and size as the first passage 58c where the passage 58c meets the first silicon plate surface 58a. The second opening 59b has generally the same shape and size as the second passage 58d where the passage 58d meets the first silicon plate surface 58a. The first and second silicon plate passages 58c and 58d and the first and second first layer openings 59a and 59b define first and second passages 52a and 52b in the support substrate 54. An outer surface 59c of the first layer 59 defines a first outer surface 54a of the support substrate 54. The second outer surface 58b of the silicon plate 58 defines a second outer surface 54b of the support substrate 54.

The spacer 56 is formed from a material selected from group consisting of ceramics, metals, silicon and polymers. It is secured to the support substrate 54 by an adhesive 56a. Example adhesives which may be used for securing the spacer 56 to the support substrate 54 include a thermally curable B-stage adhesive (polysulfone) film preform which is commercially available from Alpha Metals Inc. under the product designation "Staystik 415" and another adhesive material which is commercially available from Mitsui Toatsu Chemicals Inc. under the product designation "REGULUS."

Figure 2C:
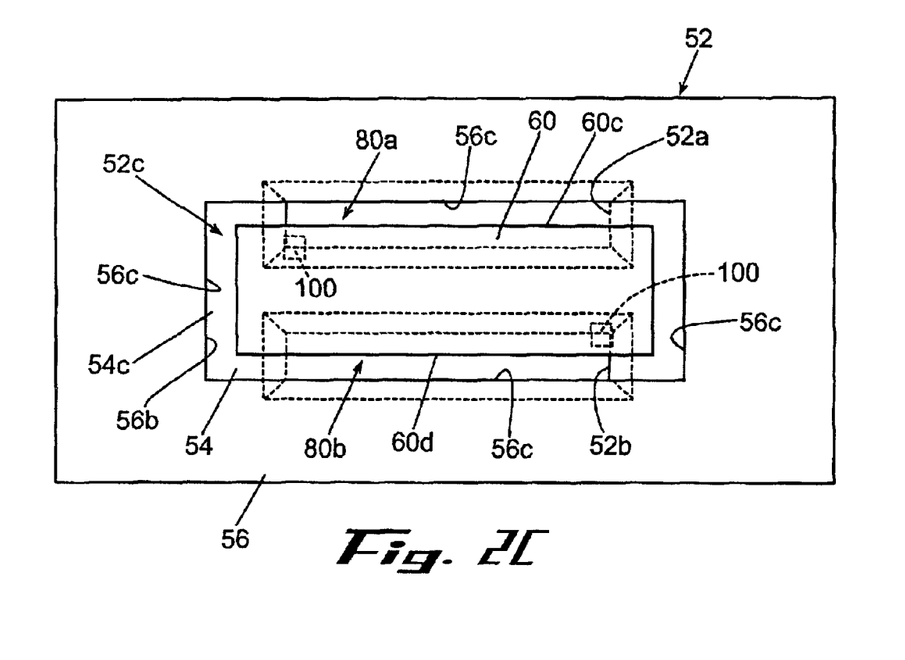
FIG. 2C is a plan view of the support substrate, spacer and heater chip of the module illustrated in FIGS. 2, 2A and 2B with the nozzle plate and flexible circuit removed.

The spacer 56 has, in the illustrated embodiment, a generally rectangular opening 56b defined by four inner side walls 56c, see FIG. 2C. A central section 54c of the second outer surface 54b of the support substrate 54 and the inner side walls 56c of the spacer 56 define an inner cavity 52c of the carrier 52, see FIGS. 2C and 8. The heater chip 60 is located in the carrier inner cavity 52c and secured to the second surface 54b of the support substrate 54. As can be seen from FIG. 2A, the first and second support substrate passages 52a and 52b communicate with the inner cavity 52c.

The inner cavity 52c and the heater chip 60 are sized such that opposing side portions 60c and 60d of the heater chip 60 are spaced from adjacent inner side walls 56c of the spacer 56 to form gaps 80a and 80b of sufficient size to permit ink to flow freely between the chip side portions 60c and 60d and the adjacent inner side walls 56c, see FIG. 2C.

The nozzle plate 70 is sized to extend over an outer portion 56d of the spacer 56 surrounding the opening 56b such that the inner cavity 52c is sealed to prevent ink from leaking from the inner cavity 52c, see FIG. 2A. The passages 52a and 52b provide a path for ink to travel from the container 22 to the inner cavity 52c. From the inner cavity 52c, the ink flows into the ink supply channels 65a.

The resistive heating elements 62 are individually addressed by voltage pulses provided by a printer energy supply circuit (not shown). Each voltage pulse is applied to one of the heating elements 62 to momentarily vaporize the ink in contact with that heating element 62 to form a bubble within the bubble chamber 65 in which the heating element 62 is located. The function of the bubble is to displace ink within the bubble chamber 65 such that a droplet of ink is expelled from a nozzle 74 associated with the bubble chamber 65.

A flexible circuit 90, secured to the polymeric container 22 and the spacer 56, is used to provide a path for energy pulses to travel from the printer energy supply circuit to the heater chip 60. Bond pads 68 on the heater chip 60 are wire-bonded to sections 92a of traces 92 in the flexible circuit 90, see FIGS. 2 and 2B. Current flows from the printer energy supply circuit to the traces 92 on the flexible circuit 90 and from the traces 92 to the bond pads 68 on the heater chip 60. Conductors (not shown) are formed on the heater chip base 64 and extend from the bond pads 68 to the heating elements 62. The current flows from the bond pads 68 along the conductors to the heating elements 62.

The process for forming the support substrate 54 will now be described with reference to FIGS. 3–7. A silicon wafer 158 having a thickness $T_p$ of from about 400 microns to about 2500 microns and preferably from about 500 microns to about 1000 microns is provided. The thickness of the wafer 158 is not critical and may fall outside of this range. A plurality of support substrates 54 are formed on a single wafer 158. For ease of illustration, only a portion of the wafer 158 is illustrated in FIGS. 3–7.

Figure 3:
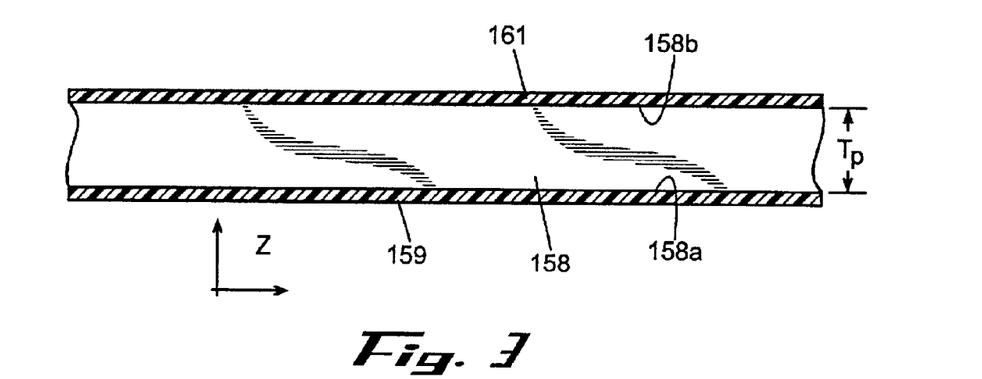
FIGS. 3–7 are schematic cross sectional views illustrating the process for forming the support substrate illustrated in FIGS. 2A and 2B.
Figure 4:
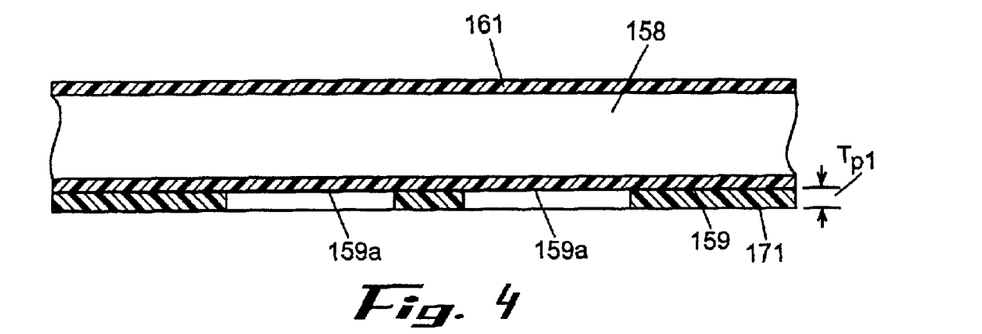

First and second etch resistant material layers 159 and 161 are formed on first and second sides 158a and 158b of the wafer 158, see FIG. 3. The layers 159 and 161 may be formed from any one of a number of known etch resistant materials including, for example, silicon nitride, silicon carbide, aluminum, tantalum, silicon dioxide, and the like. In the illustrated embodiment, silicon nitride is deposited simultaneously onto the outer surfaces of the wafer 158 using a conventional low-pressure vapor deposition process or a plasma enhanced chemical vapor deposition process. Alternatively, silicon dioxide layers may be thermally grown on the wafer 158, or aluminum or tantalum layers may be formed on the opposing wafer surfaces via a conventional sputter or evaporation process.

The first layer 159 has a thickness in the Z-direction, see FIG. 3, of from about 1 micron to about 20 microns, and preferably from about 1.0 micron to about 2.5 microns. The second layer 161 has a thickness in the Z-direction of from about 1 micron to about 20 microns, and preferably from about 1.0 micron to about 2.5 microns.

After the first and second layers 159 and 161 are deposited onto the wafer 158, a first photoresist layer 171 is formed over the first etch resistant material layer 159 via a conventional spinning process. The layer 171 has a thickness of $T_{P1}$ of from about 100 angstroms to about 50 microns, and preferably from about 1.0 micron to about 5.0 microns. The photoresist material may be a negative or a positive photoresist material. In the illustrated embodiment, the layer 171 is formed from a negative photoresist material which is commercially available from Olin Microelectronic Materials under the product designation "SC-100 Resist." After the photoresist layer 171 is spun onto the wafer 158, it is softbaked at an appropriate temperature so as to partially evaporate photoresist solvents to promote adhesion of the layer 171 to the first layer 159. A further reason for softbaking the layer 171 is to prevent a first mask, to be discussed below, from adhering to the layer 171.

A first mask (not shown), having a plurality of blocked or covered areas which correspond to the first and second openings 59a and 59b in the first layer 59, is positioned over the first photoresist layer 171. The first mask is aligned in a conventional manner such as to the wafer flat (not shown). Thereafter, unblocked portions of the first photoresist layer 171 are exposed to ultraviolet light to effect curing or polymerization of the exposed portions. The first mask is then removed. Thereafter, the unexposed or uncured portions of the first photoresist layer 171 are removed using a conventional developer chemical. In the illustrated embodiment, the unpolymerized portions are removed by spraying a developer, such as one which is commercially available from Olin Microelectronic Materials under the product designation "PF developer," onto the first wafer side while the wafer 158 is spinning. After the development process has been initiated, a mixture of about 90% developer chemical and 10% isopropyl alcohol, by volume, is sprayed onto the first side of the spinning wafer 158. Finally, the development process is stopped by spraying only isopropyl alcohol onto the spinning wafer 158. After the unpolymerized portions of the first photoresist layer 171 are removed from the wafer 158, portions 159a of the first etch resistant material layer 159 are exposed, see FIG. 4.

Instead of spraying the three different development compositions onto the wafer 158, the wafer 158 may be sequentially placed in three baths containing, respectively, 100% developer, a mixture of about 90% developer and 10% isopropyl alcohol, and 100% isopropyl alcohol. The wafer 158 remains in the first bath until the development process has been initiated. It is removed from the second bath and placed in the third bath after the unpolymerized portions of the first layer 171 have been removed. The wafer 158 is preferably agitated when in each of the baths.

Following the development of the first photoresist layer 171, the first layer 171 is hardbaked in a conventional manner so as to effect final evaporation of remaining solvents in the layer 171.

Figure 5:
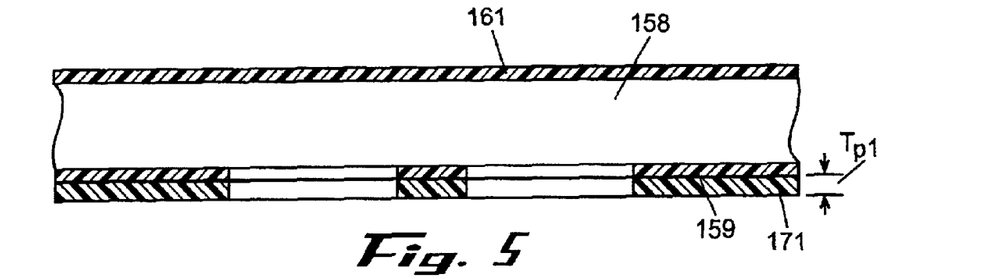
Figure 6:
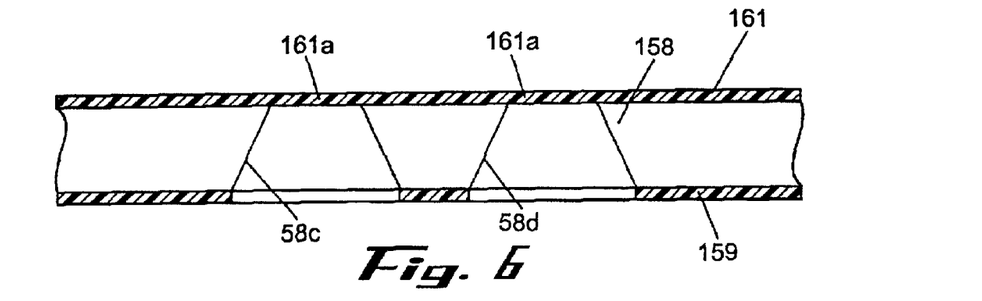
Figure 7:
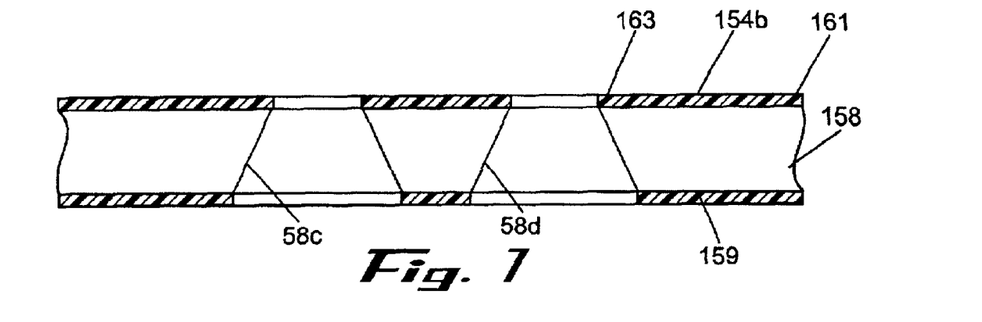

The pattern formed in the first photoresist layer 171 is transferred to the first etch resistant material layer 159, see FIG. 5, using a conventional etching process. For example, a conventional reactive ion etching process may be used. When the first etch resistant material layer 159 is formed from silicon nitride, the reactive gas supplied to the reactive ion etcher is $CF_4$. For etching of aluminum, a chlorine gas may be supplied. When the layer 159 is formed from tantalum, a $CF_4$ gas is preferably provided.

After the pattern has been transferred to the first etch resistant material layer 159, the polymerized photoresist material remaining on the wafer 158 is removed in a conventional manner. For example, a conventional reactive ion etcher receiving an $O_2$ plasma may be used. Alternatively, a commercially available resist stripper such as one which is available from Olin Microelectronic Materials under the product designation "Microstrip" may be used.

Next, a micromachining step is implemented to form the passages 58c and 58d in the silicon wafer 158. This step involves placing the wafer 158 in an etchant bath such that exposed portions of the silicon are etched away. A tetramethyl ammonium hydroxide (TMAH) based bath may be used. The TMAH based bath comprises, by weight, from about 5% to about 40%, and preferably about 10% tetramethyl ammonium hydroxide, and from about 60% to about 95%, and preferably about 90%, water. The TMAH/water solution is passivated by dissolving silicon and/or silicic acid into the TMAH/water solution until the solution has a pH of from about 11 to about 13. A more detail discussion of passivating TMAH solutions can be found in the paper: U. Schnakenberg, W. Benecke, and P. Lange, *THAHW Etchants for Silicon Micromachining*, " In Proc. Int. Conf. on Solid State Sensors and Actuators (Transducers 1991), pages 815–818, San Francisco, June 1991, the disclosure of which is incorporated herein by reference. The passivated TMAH/water solution is advantageous as it will not attack a metal etch resistant layer. If the first etch resistant material layer 159 is formed from a non-metal, such as silicon nitride, a potassium hydroxide (KOH) based bath may be used. The KOH bath comprises, by weight, from about 5% to about 75%, and preferably about 45% potassium hydroxide, and from about 25% to about 95%, and preferably about 55% water.

Thus, if the first etch resistant material layer 159 is formed from a metal, such as aluminum or tantalum, a tetramethyl ammonium hydroxide (TMAH) based bath should be used as a KOH bath will attack the metal layer 159. When sufficient etching has occurred such that the passages 58c and 58d are formed, see FIG. 6, the wafer 158 is removed from the bath.

When a KOH solution is used, the following equations describe the resulting geometry of the passages 58c and 58d:

$$W_{E1}=W_{E2}+T_P(1.414)$$

$$L_{E1}=L_{E2}+T_P(1.414)$$

where $W_{E1}$ is the width of the entrance of each of the passages 58c and 58d, see FIG. 8;

$W_{E2}$ is the width of the exit of each of the passages 58c and 58d;

$L_{E1}$ is the length of the entrance of each of the passages 58c and 58d, where the length of the entrance extends transversely to the width of the entrance (not shown in the drawings but extends in and out of the paper as viewed in FIG. 8); and $L_{E2}$ is the length of the exit of each of the passages 58c and 58d, where the length of the exit extends transversely to the width of the exit (not shown in the drawings but extends in and out of the paper as viewed in FIG. 8).

When a TMAH solution is used, the following equations describe the resulting geometry of the passages 58c and 58d:

$$W_{E1}=W_{E2}+T_p(2/\tan Q)$$

$$L_{E1}=L_{E2}+T_p(2/\tan Q)$$

where $W_{E1}$ is the width of the entrance of each of the passages 58c and 58d;

$W_{E2}$ is the width of the exit of each of the passages 58c and 58d;

$L_{E1}$ is the length of the entrance of each of the passages 58c and 58d, where the length extends transversely to the width of the entrance (not shown in the drawings but extends in and out of the paper as viewed in FIG. 8);

$L_{E2}$ is the length of the exit of each of the passages 58c and 58d, where the length extends transversely to the width of the exit (not shown in the drawings but extends in and out of the paper as viewed in FIG. 8);

Q is the angle formed by a sidewall of each of the passages 58c and 58d and a horizontal plane, see FIG. 8.

Thereafter, the second etch resistant material layer 161 is removed using a conventional reactive ion etcher. Alternatively, only sections 161a of the layer 161 may be removed during a wafer washing step using a conventional wafer washer, see FIGS. 6 and 7. In this embodiment, an upper surface 163 of the second layer 161 defines the upper surface 154b of the support substrate 54. Thus, the heater chip 60 is bonded to the upper surface 163 of the second layer 161 in this embodiment. If the entire second layer 161 is removed, the heater chip 60 is bonded to the second outer surface 58b of the silicon plate 58.

After removal of the second layer 161 or sections 161a of the second layer 161, the wafer 158 is diced into individual support substrates 54.

Figure 11:
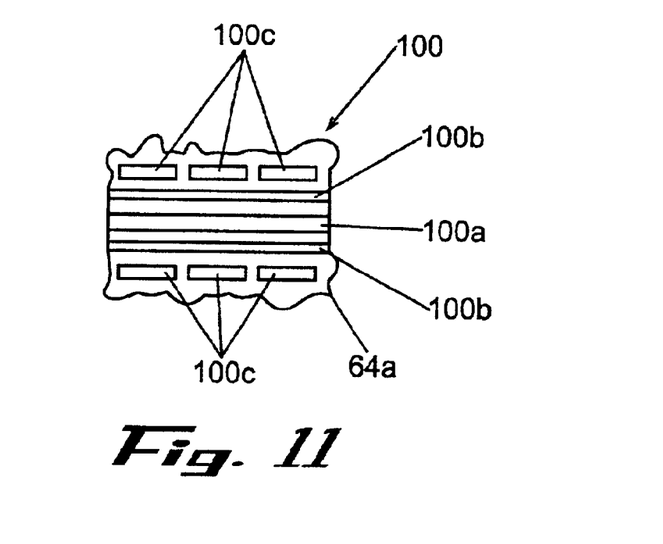
FIG. 11 is a plan view of a marker on the bottom surface of a heater chip.

The heater chip 60 is preferably formed with two alignment markers 100 on its bottom surface 64a, see FIG. 2C. An alignment marker 100 formed in accordance with the present invention is illustrated in FIG. 11. It comprises a center line 100a, two thinner side lines 100b positioned on opposite sides of the center line 100a and two dotted lines 100c positioned outside of the two side lines 100b. The center line 100a and the dotted lines each have a width of approximately 10 microns. The side lines 100b have a width of approximately 5 microns. The lines 100a, 100b and 100c are separated from one another by approximately 10 microns.

The markers 100 are formed in the following manner. A positive photoresist layer formed, for example, from a material commercially available from Shipley Company Inc. under the product designation "1827 Positive Resist" is spun onto an outer surface of a silicon wafer (not shown) to a thickness of approximately 3 microns. Typically, a plurality of heater chips 60 are formed on a single wafer. Preferably, the markers 100 are formed on the wafer after the heating elements, conductors and other elements of the heater chips are formed. After being spun onto the wafer, the photoresist layer is softbaked at an appropriate temperature so as to partially evaporate photoresist solvents.

A second mask (not shown), having a plurality of blocked or covered areas which correspond to background areas between the lines 100a, 100b and 100c, is positioned over the photoresist layer. The mask is aligned in a conventional manner such as by an infra-red mask aligner to two or more elements, e.g., heating elements or conductors, previously formed on the opposite side of the wafer. Thereafter, unblocked portions of the photoresist layer are exposed to ultraviolet light to change the chemical structure of the photoresist material from relatively nonsoluble to much more soluble. The mask is then removed. Following removal of the mask, the photoresist layer is soaked in a chlorobenzene bath for approximately five minutes. The photoresist is then developed using, for example, a material commercially available from Shipley Co. Inc. under the product designation "Microposit MF319." During this development step, the photoresist layer portions exposed to the ultraviolet radiation are removed.

Following the development step, a layer of chromium is sputtered onto the wafer to a thickness of approximately 500 angstroms. The wafer is then soaked in acetone for approximately five minutes to remove the remaining photoresist material and portions of the chromium layer formed over the remaining photoresist material. The chromium material remaining after the acetone soaking process comprises the markers 100.

The process for forming the heater chip module 50 illustrated in FIGS. 2, 2A and 2B will now be described. As noted above, the nozzle plate 70 comprises a flexible polymeric material substrate. In the illustrated embodiment, the flexible substrate is provided with an overlaid layer of phenolic butyral adhesive for securing the nozzle plate 70 to the heater chip 60.

Initially, the nozzle plate 70 is aligned with and mounted to the heater chip 60. At this point, the heater chip 60 has been separated from other heater chips 60 formed on the same wafer. Alignment may take place as follows. One or more first fiducials (not shown) may be provided on the nozzle plate 70 which are aligned with one or more second fiducials (not shown) provided on the heater chip 60. After the nozzle plate 70 is aligned to and located on the heater chip 60, the plate 70 is tacked to the heater chip 60 using, for example, a conventional thermocompression bonding process. The phenolic butyral adhesive on the nozzle plate 70 is not fully cured after the tacking step has been completed.

Either before or after the nozzle plate 70 is tacked to the heater chip 60, the spacer 56 is bonded to the support substrate 54. At this juncture, the support substrate 54 has been separated from other support substrates 54 formed on the same wafer. A layer of the adhesive 56a, examples of which are noted above, is applied to the second outer surface 54b of the support substrate 54 where the spacer 56 is to be positioned. The spacer 56 is then mounted to the support substrate 54. Thereafter, the adhesive 56a is fully cured using heat and pressure.

A further adhesive material (not shown), such as a 0.002 inch die-cut phenolic adhesive film, which is commercially available from Rogers Corporation (Chandler, Ariz.) under the product designation "1000B200," is placed on a portion 56e of the spacer 56 to which the flexible circuit 90 is to be secured. Thereafter, the flexible circuit 90 is positioned over the adhesive film and tacked to the spacer 56 using heat and pressure. In the illustrated embodiment, the flexible circuit 90 is coupled to the spacer 56 after the spacer 56 has been bonded to the support substrate 54. It is also contemplated that the flexible circuit 90 may be coupled to the spacer 56 before the spacer 56 is secured to the support substrate 54.

The nozzle plate/heater chip assembly is then mounted to the support substrate/spacer assembly. Initially, a conventional die bond adhesive 110, such as a substantially transparent phenolic polymer adhesive which is commercially available from Georgia Pacific under the product designation "BKS 2600," is applied to the second outer surface 54b of the support substrate 54 at locations where one or more heater chips 60 are to be located. It is contemplated that one or two or more heater chips 60 may be secured to a single support substrate 54. For example, two heater chips 60 may be positioned end to end, side by side or offset from one another on the support substrate 54. Two heater chips 60 may be provided in the same or different inner cavities 52c. Thereafter, the two markers 100 on the bottom surface 64a of each heater chip 60 are aligned relative to inner edges 58e and 58f of the silicon plate 58, see FIGS. 2A and 8. The heater chip 60 is in alignment when the center line 100a of one of its two markers 100 is positioned over edge 58e and the center line 100a of the other marker 100 is positioned over edge 58f. The markers 100 may be viewed using, for example, a video microscope (not shown) which generates an output signal provided to either a monitor for analysis by human vision or to an optical analyzer for analysis by an electronic device. It is also contemplated that an operator may view the markers 100 through an eyepiece of a standard microscope.

Alternatively, alignment markers (not shown), two for each heater chip 60, may be formed on the second outer surface 54b of the support substrate 54. The markers 100 on the heater chip 60 and the markers on the support substrate 54 are located respectively on the heater chip 60 and the support substrate 54 such that when the markers are in alignment with one another the heater chip 60 is properly aligned to the support substrate 54. A conventional infra-red aligner may be used to effect alignment of the markers on the heater chip 60 and the support substrate 54.

The nozzle plate/heater chip assembly is tacked to the support substrate/spacer assembly so as to maintain the two assemblies joined together until the die bond adhesive 110 is cured. Before the nozzle plate/heater chip assembly is mounted onto the support substrate/spacer assembly, a conventional ultraviolet (UV) curable adhesive (not shown), such as one which is commercially available from Emerson and Cuming Specialty Polymers, a division of National Starch and Chemical Company under the product designation UV9000, is applied to one or more locations on the support substrate 54 where corners of the heater chip 60 are to be located. After the nozzle plate/heater chip assembly is mounted to the support substrate/spacer assembly, exposed adhesive is cured using ultraviolet radiation to effect tacking.

Next, the nozzle plate/heater chip assembly and the support substrate/spacer assembly are heated in an oven at a temperature and for a time period sufficient to effect the curing of the following materials: the phenolic butyral adhesive that bonds the nozzle plate 70 to the heater chip 60 and the spacer 56; the phenolic adhesive film which joins the flexible circuit 90 to the spacer 56; and the die bond adhesive 110 which joins the heater chip 60 to the support substrate 54. During the heating step, pressure may or may not be applied to the nozzle plate/heater chip assembly and the support substrate/spacer assembly.

After the nozzle plate/heater chip assembly and the flexible circuit 90 have been bonded to the support substrate/spacer assembly, sections 92a of the traces 92 on the flexible circuit 90 are wire-bonded to the bond pads 68 on the heater chip 60, see FIGS. 2 and 2B. A single wire 112 extends between each bond pad/trace section pair after wire-bonding has been completed. The wires 112 extend through windows or openings 71 formed in the nozzle plate 70. It is also contemplated that the nozzle plate 70 may be sized so that the wires 112 do not extend through windows in the nozzle plate 70 such as described in the above referenced patent application entitled "AN INK JET HEATER CHIP MODULE WITH SEALANT MATERIAL." It is also contemplated that trace sections may be coupled to the bond pads 68 via a conventional Tape Automated Bonding (TAB)

process such as in the manner disclosed in the above referenced patent application entitled "AN INK JET HEATER CHIP MODULE INCLUDING A NOZZLE PLATE COUPLING A HEATER CHIP TO A CARRIER". After wire-bonding or TAB bonding, a liquid encapsulant material 114, such as an ultraviolet (UV) curable adhesive, one of which is commercially available from Emerson and Cuming Specialty Polymers, a division of National Starch and Chemical Company under the product designation "UV9000," shown in FIG. 2B, is applied over the trace sections 92a, the bond pads 68, the wires 112 and the windows 71. The UV adhesive is then cured using ultraviolet light.

The heater chip module 50, which comprises the nozzle plate/heater chip assembly and the support substrate/spacer assembly, and to which the flexible circuit 90 is tacked, is aligned with and bonded directly to a polymeric container 22. An adhesive (not shown) such as one which is commercially available from Emerson and Cuming Specialty Polymers, a division of National Starch and Chemical Company under the product designation "ECCOBOND 3193-17" is applied to a portion of the container where the module 50 is to be located. The module 50 is then mounted to the container portion.

Next, the heater chip module 50 and container 22 are heated in an oven at a temperature and for a time period sufficient to effect the curing of the adhesive that joins the heater chip module 50 to the container 22.

A portion of the flexible circuit 90 which is not joined to the spacer 56 is bonded to the container 22 by, for example, a conventional free-standing pressure sensitive adhesive film, such as described in copending patent application U.S. Ser. No. 08/827,140, entitled "A PROCESS FOR JOINING A FLEXIBLE CIRCUIT TO A POLYMERIC CONTAINER AND FOR FORMING A BARRIER LAYER OVER SECTIONS OF THE FLEXIBLE CIRCUIT AND OTHER ELEMENTS USING AN ENCAPSULANT MATERIAL," filed Mar. 27, 1997, the disclosure of which is incorporated herein by reference.

It is also contemplated that the heater chip 60 may be secured to the support substrate 54 by silicon fusion bonding, eutectic bonding, or anodic bonding. In anodic bonding, a thin layer of sputtered glass is put down on the second outer surface 54b of the support substrate 54 where the one or more heater chips 60 are to be secured. An example ionic glass material is one which is commercially available from Corning Inc. under the product designation "Glass Code 7440." Anodic bonding involves the application of heat and the simultaneous application of a high voltage across the support substrate 54 and the heater chip 60.

Figure 9:
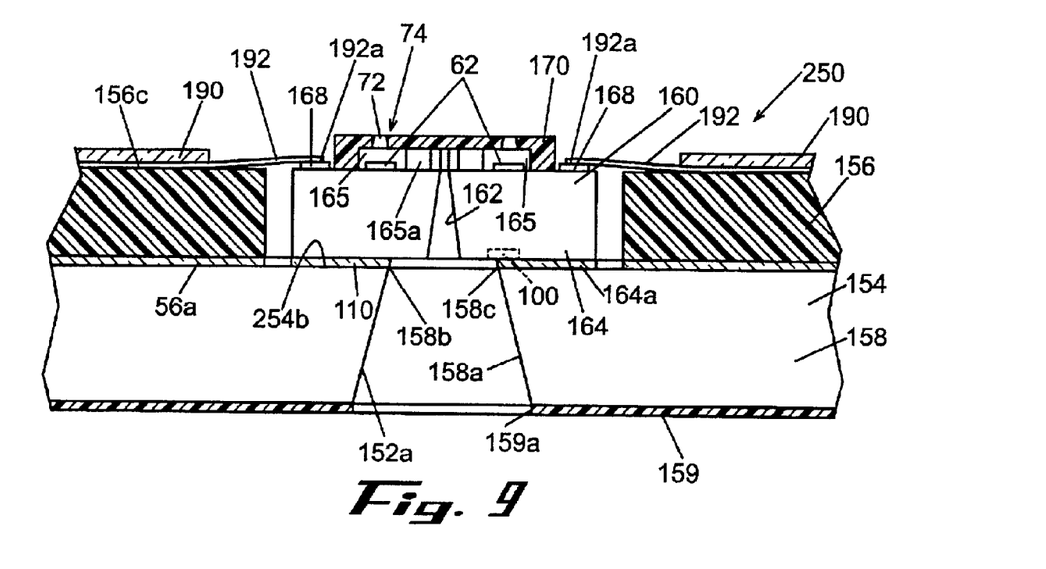
FIG. 9 is a cross sectional view of a portion of a heater chip module constructed in accordance with a second embodiment of the present invention.
Figure 10:
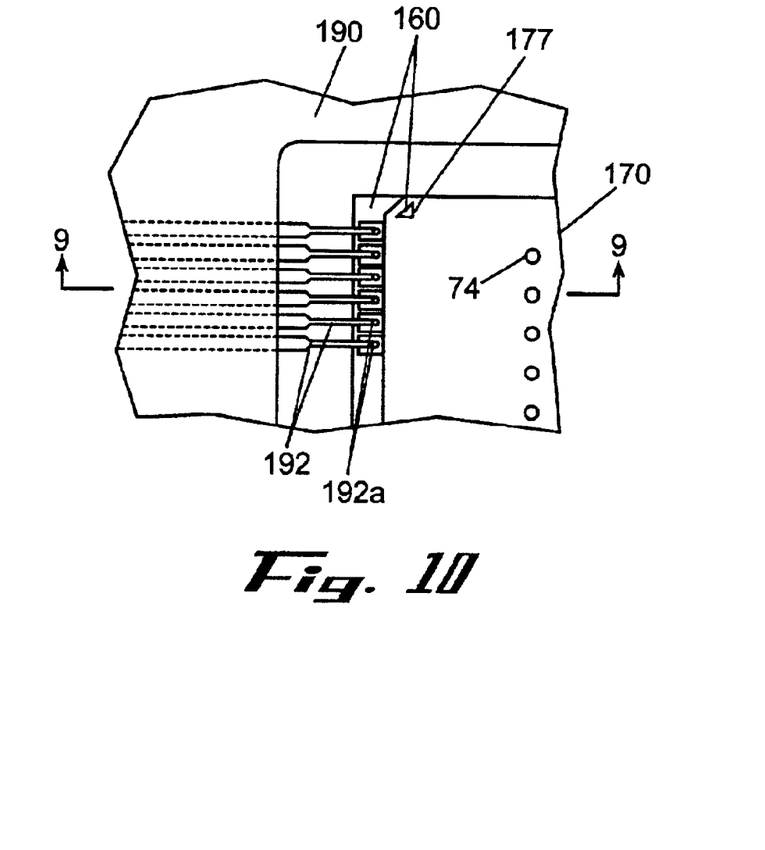
FIG. 10 is a plan view of a portion of the heater chip module illustrated in FIG. 9.

A heater chip module 250, formed in accordance with a second embodiment of the present invention, is shown in FIGS. 9 and 10, wherein like reference numerals indicate like elements. Here, the support substrate 154 is formed having only one passage 152a for each heater chip 160. The heater chip 160 comprises a conventional center feed heater chip having a center ink-receiving via 162. Ink from the container 22 travels through the passage 152a in the support substrate 154 to the via 162. From the via 162, the ink passes through supply channels 165a in the nozzle plate 170 to bubble channels 165 defined by portions of the heater chip 160 and sections of the nozzle plate 170.

The support substrate 154 may be formed from substantially the same materials from which the support substrate 54 in the FIG. 2 embodiment is formed. Further, the process steps described above for forming the support substrate 54 may also be used when forming the support substrate 154. However, only one passage 158a is formed through the silicon plate 158 and one opening 159a is formed in the first etch resistant layer 159 for each heater chip 160.

Assembly of the components of the heater chip module 250 may occur in the following manner. Initially, the nozzle plate 170 is aligned with and mounted to the heater chip 160. Typically, a plurality of heater chips 160 are formed on a single wafer. In this embodiment, a nozzle plate 170 is mounted to each heater chip 160 before the wafer is diced. Alignment may take place as follows. One or more first fiducials (not shown) may be provided on the nozzle plate 170 which are aligned with one or more second fiducials (not shown) provided on the heater chip 160. After the nozzle plate 170 is aligned to and located on the heater chip 160, the plate 170 is tacked to the heater chip 160.

The nozzle plate 170 includes one or more openings 177 which, in the illustrated embodiment, are triangular in shape, see FIG. 10. The openings 177 may be circular, square or have another geometric shape. An ultraviolet (UV) curable adhesive (not shown), such as one which is commercially available from Emerson and Cuming Specialty Polymers, a division of National Starch and Chemical Company under the product designation UV9000 is applied over the openings 177 so as to contact both the nozzle plate 170 and the heater chip 160. Thereafter, the adhesive is cured using UV radiation to effect tacking. Each heater chip 160 on the heater chip wafer receives a nozzle plate 170 which is tacked to its corresponding heater chip 160 in this manner. After tacking has been completed, the nozzle plates 170 are permanently bonded to the heater chips 160 on the wafer by curing the layer of phenolic butyral adhesive provided on the underside of each nozzle plate 170 using, for example, a conventional thermocompression bonding process. Thereafter, the heater chip wafer is diced so as to separate the nozzle plate/heater chip assemblies from one another.

After the heater chip wafer has been diced, a flexible circuit 190 is attached to the heater chip 160 of each nozzle plate/heater chip assembly. End sections 192a of traces 192 on the flexible circuit 190 are TAB bonded to the bond pads 168 on the heater chip 160, see FIGS. 9 and 10. It is also contemplated that trace sections may be coupled to the bond pads 168 via a wire-bonding process. However, such a wire-bonding step would most likely occur after the flexible circuit 190 is attached to the spacer 156.

Either before or after the nozzle plate 170 is tacked to the heater chip 160, the spacer 156 is bonded to the support substrate 154 using the same process and adhesive described above for bonding the spacer 56 to the support substrate 54.

A further adhesive material (not shown), such as a 0.002 inch die-cut phenolic adhesive film, which is commercially available from Rogers Corporation under the product designation "1000B200," is placed on a portion 156e of the spacer 156 to which the flexible circuit 190 is to be secured.

After the nozzle plate 170 has been bonded to the heater chip 160, the spacer 156 has been bonded to the support substrate 154, and the phenolic adhesive film has been placed on the spacer 156, the nozzle plate/heater chip assembly is aligned with and tacked to the support substrate/spacer assembly. Initially, a die bond adhesive 110 is applied to the second outer surface 254b of the support substrate 154 at a location where the heater chip 160 is to be located. A pair of markers 100, formed on the bottom surface 164a of the heater chip base 164 on opposite sides of the via 162, are then aligned to inner edges 158b and 158c of the silicon plate 158. The edges 158b and 158c define an outer edge of the passage 152a.

The nozzle plate/heater chip assembly is tacked to the support substrate/spacer assembly so as the maintain the two assemblies joined together until the die bond adhesive 110 is cured. Before the nozzle plate/heater chip assembly is mounted onto the support substrate/spacer assembly, a conventional ultraviolet (UV) curable adhesive (not shown), such as one which is commercially available from Emerson and Cuming Specialty Polymers, a division of National Starch and Chemical Company under the product designation UV9000, is applied to one or more locations on the support substrate 154 where corners of the heater chip 160 are to be positioned. After the nozzle plate/heater chip assembly is mounted to the support substrate/spacer assembly, exposed adhesive is cured using ultraviolet radiation to effect tacking.

Once the nozzle plate/heater chip assembly is mounted to the support substrate/spacer assembly, the flexible circuit 190 contacts the phenolic adhesive film placed on the spacer 156. The flexible circuit 190 is tacked to the spacer 156 using a conventional thermocompression bonding apparatus.

Next, the nozzle plate/heater chip assembly and the support substrate/spacer assembly are heated in an oven at a temperature and for a time period sufficient to effect the curing of the following materials: the phenolic adhesive film which joins the flexible is circuit 190 to the spacer 156 and the die bond adhesive 110 which joins the heater chip 160 to the support substrate 154.

A liquid encapsulant material (not shown) such as an ultraviolet (UV) curable adhesive, one of which is commercially available from Emerson and Cuming Specialty Polymers, a division of National Starch and Chemical Company under the product designation UV9000, is then applied over the trace end sections 192a and the bond pads 168. Thereafter, the UV adhesive is cured using UV light.

The heater chip module 250, which comprises the nozzle plate/heater chip assembly and the support substrate/spacer assembly, and to which the flexible circuit 190 is tacked, is aligned with and bonded directly to a polymeric container 22. An adhesive (not shown) such as one which is commercially available from Emerson and Cuming Specialty Polymers, a division of National Starch and Chemical Company under the product designation "ECCOBOND 3193-17" is applied to a portion of the container where the module 250 is to be located. The module 250 is then mounted to the container portion.

Next, the heater chip module 250 and the container 22 are heated in an oven at a temperature and for a time period sufficient to effect the curing of the adhesive that joins the heater chip module 250 to the container 22.

A portion of the flexible circuit 190 which is not joined to the spacer 156 is bonded to the container 22 by, for example, a conventional free-standing pressure sensitive adhesive film.

It is also contemplated that the flexible circuit 190 may be coupled to the bond pads 168 on the heater chip 160 after the nozzle plate/heater chip assembly is secured to the support substrate/spacer assembly.

It is further contemplated that the nozzle plate 70, 170 may be coupled to the heater chip 60, 160 after the heater chip 60, 160 is bonded to the support substrate 54, 154.

Because a substantial portion 58 of the support substrate 54, 154 is formed from a material having substantially the same coefficient of thermal expansion as the heater chip is base 64, 164, the heater chip base 64, 164 and the support substrate 54, 154 expand and contract at essentially the same rate. This is advantageous for a number of reasons. First, it is less likely that bonding material joining the heater chip to the carrier will fail. Further, if two or more heater chips are secured to the carrier, accuracy of dot placement is increased as the location of the heater chips relative to the paper is less likely to vary. The support substrate portion 58 is also formed from a material having a thermal conductivity which is substantially the same as the thermal conductivity of the material from which the heater chip base 64, 164 is formed. Hence, the carrier provides a dissipation path for heat generated by the heater chip. Consequently, heat build up in the heater chip, which might occur if the thermal conductivity of the support substrate portion is less than that of the heater chip base, is avoided. The support substrate portion may also be formed from a material having a thermal conductivity which is greater than the thermal conductivity of the material from which the heater chip base is formed.

It is further contemplated that the support substrate may be formed from a commercially available chemical vapor deposition (CVD) diamond wafer. CVD diamond wafer material has a coefficient of thermal expansion which is approximately equal to that of silicon. Further, it has a thermal conductivity which is greater than that of silicon. This material is commercially available from Norton Diamond Film of Northboro, Mass.

What is claimed is:

1. A process for forming an ink jet heater chip module comprising the steps of:

providing a carrier comprising a support substrate, the support substrate having a first outer surface and a second outer surface and having at least one passage extending therethrough from the first outer surface to the second outer surface, at least a portion of said support substrate being formed from silicon;

providing a heater chip having a first surface and a second surface opposite the first surface, the heater chip containing a plurality of heating elements on the second surface thereof;

providing a nozzle plate;

securing said nozzle plate to the second surface of said heater chip; and securing the first surface of said heater chip to the second outer surface of said support substrate, so that the nozzle plate is on an opposite side of the heater chip from the support substrate.

2. The process for fanning an ink jet heater chip module as set forth in claim 1, wherein said step of providing a carrier including a support substrate having at least one passage extending therethrough comprises the steps of:

providing a silicon plate having first and second outer surfaces;

forming a first etch resistant material layer on said silicon plate first outer surface, said first layer including at least one opening extending through said first layer; and forming a second etch resistant material layer on said silicon plate second outer surface.

3. The process for forming an ink jet heater chip module as set forth in claim 2, wherein said step of providing a carrier including a support substrate having at least on passage extending therethrough further comprises the step of forming at least one passage through said silicon plate which communicates with said opening in said first layer.

4. The process for forming an ink jet heater chip module as set forth in claim 3, wherein said step of forming at least one passage through said silicon plate comprises the step of etching through said silicon plate from an exposed portion of said first outer surface of said silicon plate to said second etch resistant layer such that said passage has a shape which converges inwardly from said first outer surface of said silicon plate to said second outer surface of silicon plate.

5. The process for forming an ink jet heater chip module as set forth in claim 3, wherein said step of forming at least one passage through said silicon plate comprises the step of etching through said silicon plate from an exposed portion of said first outer surface of said silicon plate using a tetramethyl ammonium hydroxide etching solution.

6. The process for forming an ink jet heater chip module as set forth in claim 3, wherein said step of forming at least one passage through said silicon plate comprises the step of etching through said silicon plate from an exposed portion of said first outer surface of said silicon plate using a potassium hydroxide etching solution.

7. The process for forming an ink jet heater chip module as sot forth in claim 2, wherein said step of providing a carrier including a support substrate having at least one passage extending therethrough further comprises the steps of:

forming at least one passage through said silicon plate which communicates with said opening in said first layer; and forming at least one opening in said second layer which communicates with said at least one passage.

8. The process for forming an ink jet heater chip module as set forth in claim 1, wherein said step of providing a carrier comprising a support substrate having at least one passage further comprises the steps of:

providing a spacer, and securing said spacer to the second outer surface of said support substrate, said spacer having an opening defined by inner side wails, a section of said second outer surface of said support substrate and said inner side walls of said spacer defining an inner cavity of said carrier, said heater chip being positioned in said inner cavity and said at least one passage communicating with said inner cavity.

9. The process for forming an ink jet heater chip module as set forth in claim 8, wherein said step of providing a heater chip comprises the step of providing a center feud heater chip.

10. The process for forming an ink jet heater chip module as set forth in claim 8, wherein said step of providing a heater chip comprises the step of providing an edge feed heater chip.

* * * * *

UNITED STATES PATENT AND TRADEMARK OFFICE
CERTIFICATE OF CORRECTION

PATENT NO. : 6,796,019 B2
DATED : September 28, 2004
INVENTOR(S) : Komplin et al.

It is certified that error appears in the above-identified patent and that said Letters Patent is hereby corrected as shown below:

Column 1,
Lines 22 and 23, change "inference" to -- reference --

Column 13,
Line 26, delete "is" after "flexible" and before "circuit"
Line 64, delete "is" after "heater chip" and before "base"

Column 14,
Line 46, change "fanning" to -- forming --
Line 59, change "on" to -- one --

Column 15,
Line 17, change "sot" to -- set --

Column 16,
Line 8, change "wails" to -- walls --
Line 18, change "feud" to -- feed --

Signed and Sealed this

Twenty-sixth Day of April, 2005

JON W. DUDAS
*Director of the United States Patent and Trademark Office*